(12) United States Patent
Weiss

(10) Patent No.: US 7,592,833 B1
(45) Date of Patent: Sep. 22, 2009

(54) SYSTEMS AND METHODS INVOLVING FIELD PROGRAMMABLE GATE ARRAYS

(75) Inventor: Adam Anthony Weiss, Minden, NV (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 12/120,872

(22) Filed: May 15, 2008

(51) Int. Cl.
H03K 19/173 (2006.01)
(52) U.S. Cl. .......................... 326/38; 326/41
(58) Field of Classification Search ............. 326/37–41, 326/47, 101
See application file for complete search history.

(56) References Cited

U.S. PATENT DOCUMENTS

| | | | |
|---|---|---|---|
| 5,990,702 A * | 11/1999 | Agrawal et al. ............... | 326/41 |
| 6,002,991 A * | 12/1999 | Conn, Jr. ..................... | 702/117 |
| 6,937,063 B1 | 8/2005 | Sun et al. | |
| 7,320,062 B2 * | 1/2008 | Master et al. ................. | 712/15 |

* cited by examiner

Primary Examiner—James Cho
(74) Attorney, Agent, or Firm—Cantor Colburn LLP

(57) ABSTRACT

A method for programming logic in a field programmable gate array (FPGA) comprising, receiving a logic process including a logic node, and associating the node with a logic descriptor, and saving the logic descriptor in a memory of the FPGA. The logic descriptor including: a unique identifier of the node, an enabling indicator operative to indicate if the node is enabled, a function indicator operative to define a logic function performed by the node, an input number indicator operative to define a number of inputs of the node, an output indicator operative to indicate a logic state of an output of the node, and an input indicator operative to indicate a unique identifier of an input of the node.

19 Claims, 5 Drawing Sheets

SYSTEMS AND METHODS INVOLVING FIELD PROGRAMMABLE GATE ARRAYS

BACKGROUND OF THE INVENTION

Embodiments of the invention relate generally to field programmable gate arrays, and more particularly to programming field programmable gate arrays.

In this regard, field programmable gate arrays (FPGA) are used in a variety of control applications. FPGAs may be used, for example, to control emergency trip systems in generator systems. FPGAs are semiconductor devices that have logic blocks that may be programmed on site to perform logic functions. If a new logic program is needed in the FPGA, the FPGA may be reprogrammed by a technician. The hardware and technical skills necessary to reprogram a FPGA on site increases the time and cost necessary to reprogram a FPGA. It is desirable for a method that allows FPGAs to be easily programmed to perform logic functions.

BRIEF DESCRIPTION OF THE INVENTION

An exemplary method for programming logic in a field programmable gate array (FPGA). The method comprising, receiving a logic process including a logic node, associating the node with a logic descriptor including, a unique identifier of the node, an enabling indicator operative to indicate if the node is enabled, a function indicator operative to define a logic function performed by the node, an input number indicator operative to define a number of inputs of the node, an output indicator operative to indicate a logic state of an output of the node, and an input indicator operative to indicate a unique identifier of an input of the node, and saving the logic descriptor in a memory of the FPGA.

An exemplary method for performing a logic process in a field programmable gate array (FPGA). The method comprising, receiving a logic descriptor list having a first logic descriptor including an unique identifier of a first node in the logic process, an enabling indicator, a logic function indicator, and an input indicator, processing the first logic descriptor by, determining whether the enabling indicator of the logic descriptor indicates that the first node is enabled, determining a logic function associated with the first node from the logic function indicator, determining a number of inputs to the first node from the input indicator, reading an output value associated with an input to the first node the from a second logic descriptor associated with a second node in the logic process, performing the logic function to determine a logic state of the first node, and updating the logic state of the first node in the first logic descriptor responsive to performing the logic function, determining whether the first logic descriptor indicates that the first logic descriptor is sequentially the last logic descriptor in the logic descriptor list, outputting a signal associated with the logic process, and receiving and processing a logic descriptor that is sequentially an initial logic descriptor in the logic descriptor list responsive to determining that the first logic descriptor is sequentially the last logic descriptor in the logic descriptor list, receiving and processing a logic descriptor that is sequentially the next logic descriptor following the first logic descriptor in the logic descriptor list responsive to determining that the first logic descriptor is not sequentially the last logic descriptor in the logic descriptor list, and receiving and processing a logic descriptor that is sequentially the next logic descriptor following the first logic descriptor in the logic descriptor list responsive to determining that the first logic descriptor is disabled.

An exemplary electronic safety trip system for a generator comprising an electronic safety trip portion having an FPGA. The FPGA operative to perform the logic process of, receiving a logic descriptor list having a first logic descriptor including an unique identifier of a first node in the logic process, an enabling indicator, a logic function indicator, and an input indicator, processing the first logic descriptor by, determining whether the enabling indicator of the logic descriptor indicates that the first node is enabled, determining a logic function associated with the first node from the logic function indicator, determining a number of inputs to the first node from the input indicator, reading an output value associated with an input to the first node the from a second logic descriptor associated with a second node in the logic process, performing the logic function to determine a logic state of the first node, and updating the logic state of the first node in the first logic descriptor responsive to performing the logic function, determining whether the first logic descriptor indicates that the first logic descriptor is sequentially the last logic descriptor in the logic descriptor list, outputting a signal associated with the logic process, operative to control the generator, and receiving and processing a logic descriptor that is sequentially an initial logic descriptor in the logic descriptor list responsive to determining that the first logic descriptor is sequentially the last logic descriptor in the logic descriptor list, receiving and processing a logic descriptor that is sequentially the next logic descriptor following the first logic descriptor in the logic descriptor list responsive to determining that the first logic descriptor is not sequentially the last logic descriptor in the logic descriptor list, and receiving and processing a logic descriptor that is sequentially the next logic descriptor following the first logic descriptor in the logic descriptor list responsive to determining that the first logic descriptor is disabled.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Further, various operations may be described as multiple discrete steps performed in a manner that is helpful for understanding embodiments of the present invention. However, the order of description should not be construed as to imply that these operations need be performed in the order they are presented, or that they are even order dependent. Moreover, repeated usage of the phrase "in an embodiment" does not necessarily refer to the same embodiment, although it may. Lastly, the terms "comprising," "including," "having," and the like, as used in the present application, are intended to be synonymous unless otherwise indicated.

Field programmable gate arrays (FPGA) are semiconductor devices that perform logic functions. An advantage of FPGAs is that they may be programmed to perform a variety of logic functions for different applications without changing the internal structure of the FPGA. Thus, a user may design a system with a logic processor and use an off the shelf FPGA to implement the logic. The use of an FPGA speeds development time by allowing a developer to use a pre-existing logic processor.

FPGAs may also be reprogrammed in the field allowing the logic to be changed without changing the hardware in a system. A disadvantage of FPGAs is that FPGAs are programmed with a hardware descriptive language (HDL). HDL is usually complex, resembling assembly code requiring specialized skills and software. Typically when a user desires new logic functions in a FPGA, the user designs the logic functions and hires a technician to convert the logic functions into HDL code used to program the FPGA. The use of HDL to program logic functions into a FPGA is costly and time consuming.

The FPGA is shut down to reprogram the FPGA with HDL code. For some applications, such as power generation, system shutdowns may be costly. A method for programming logic functions in an FPGA that does not include shutting down the system is desired.

Figure 1:
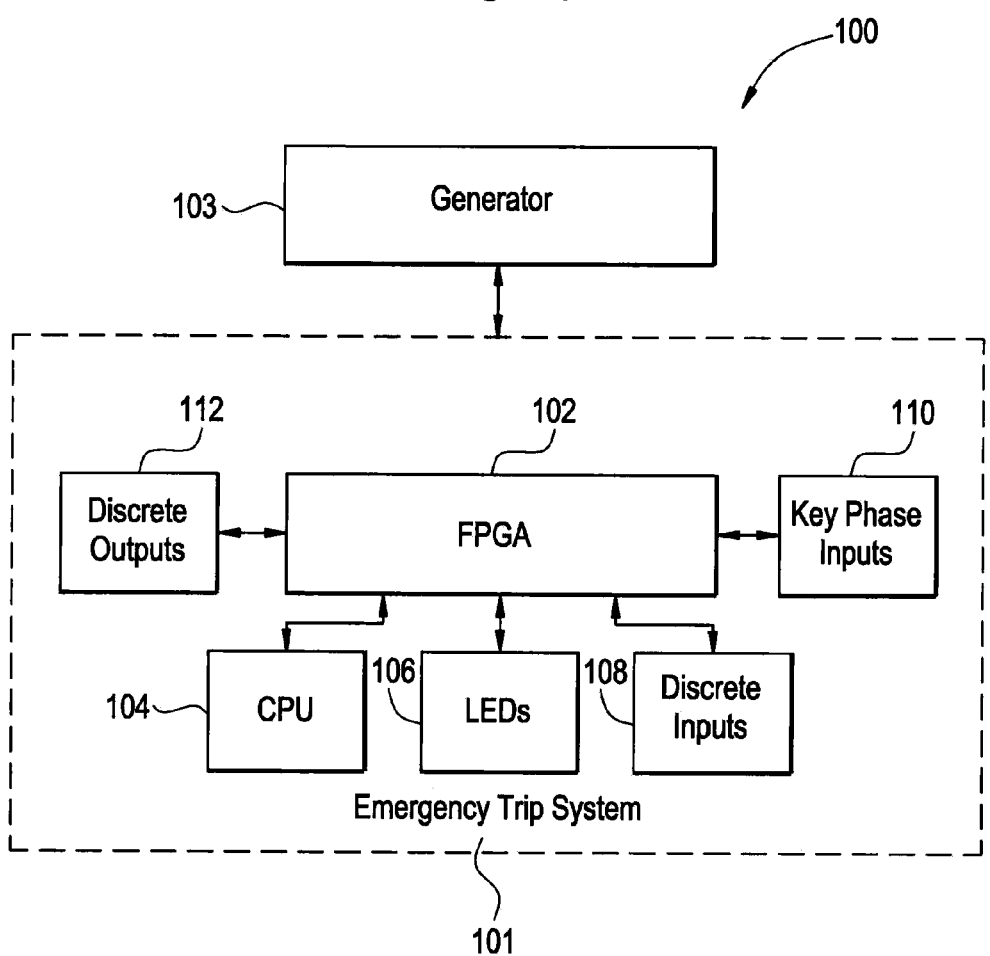
FIG. 1 illustrates an exemplary embodiment of a FPGA in an emergency trip system.

FIG. 1 illustrates an example of a system 100 that uses a FPGA. The system 100 is a power generation system including a generator 103 that is, for example, operably connected with a gas turbine. The emergency trip system (ETS) 101 is used to monitor critical operating parameters of the generator 103, and perform emergency actions such as, for example, shutting the generator 103 down if the generator 103 exceeds the operating parameters or experiences other predetermined conditions that merit a shut down. The ETS 101 includes a FPGA 102 communicatively connected to a central processing unit (CPU) 104, light emitting diodes (LEDs) 106, discrete inputs 108, and speed inputs 110. The FPGA 102 outputs discrete outputs 112. In operation, the FPGA 102 receives discrete inputs 108 such as, for example, digital inputs from relays or other sensors, and speed inputs 110 such as, for example, generator speed. The FPGA 102 may receive other inputs from the CPU 104. The FPGA 102 processes the inputs with logic and outputs discrete outputs 112 and actuates the LEDs 106 or other alarm indicators depending on the states of the inputs. If the inputs exceed the operating parameters of the generator 103, the FPGA 102 may initiate shutdown commands and actuate alarms. If operators of the system 100 intend to change the logic performed by the FPGA 102, the methods described below allow the logic performed by the FPGA 102 to be easily changed without shutting the system 100 down.

Figure 2:
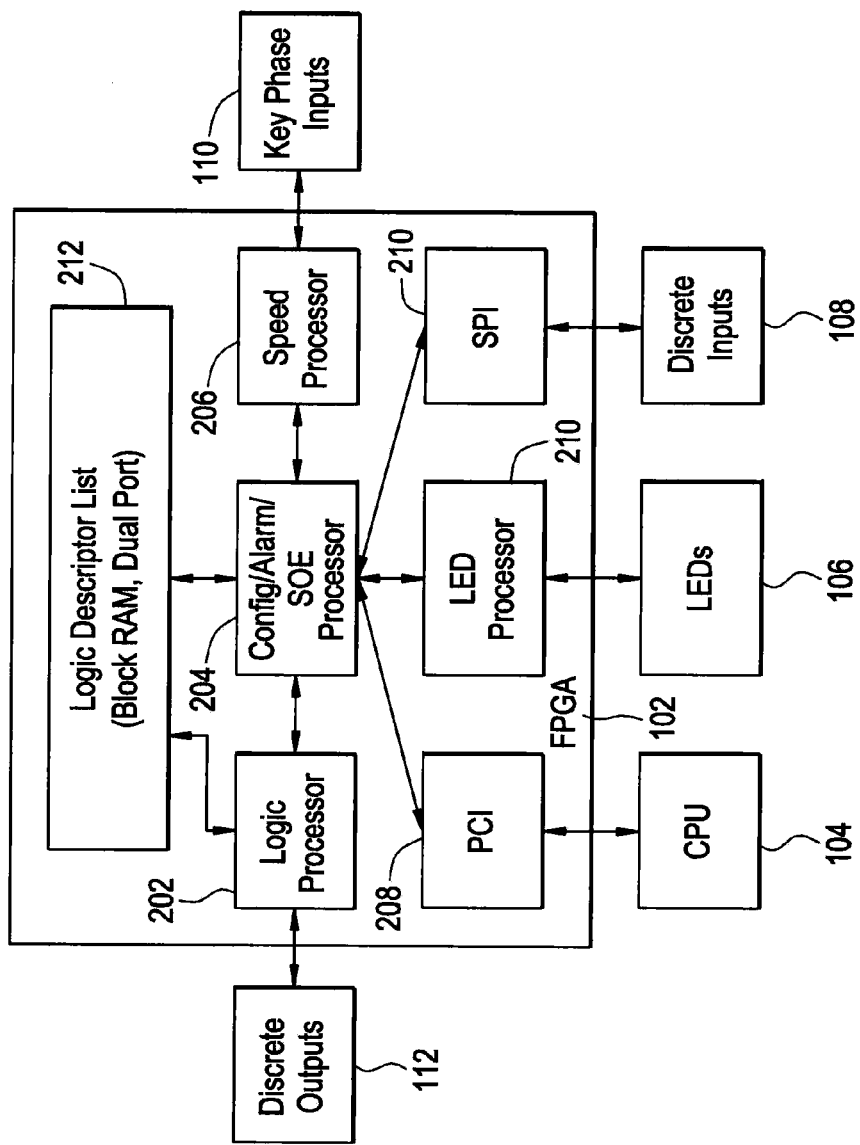
FIG. 2 illustrates a detailed block diagram of an exemplary embodiment of the FPGA.

FIG. 2 illustrates a detailed block diagram of an exemplary embodiment of the FPGA 102. The FPGA 102 includes a personal computer interface (PCI) that is communicatively connected to the CPU 104 and the configure, alarm, Sequence of Events (SOE) processor 204. A LED processor is communicatively connected to the LEDs 106 and the configure, alarm, SOE processor 204. A serial peripheral interface (SPI) 210 is communicatively connected to the discrete inputs 108 and the configure, alarm, SOE processor 204. A speed processor 206 is communicatively connected to the speed inputs 110 and the configure, alarm, SOE processor 204. A logic processor 202 is communicatively connected to the discrete outputs 112 and the configure, alarm, SOE processor 204. A logic descriptor list (LDL) 212 comprising block random access memory (RAM) that is dual port is communicatively connected to the logic processor 202 and the configure, alarm, SOE processor 204.

In operation, the configure, alarm, SOE processor 204 sends digital inputs to the logic processor 202. The logic processor 202 receives strings of bits that represent logic functions from the LDL 212. The logic processor 202 performs the logic functions and outputs digital signals to the discrete outputs 112 and the configure, alarm, SOE processor 204. Some of the inputs, such as, for example, the discrete inputs 108 are inputs that represent discrete digital values such as a 1 or a 0. A sensor may process a sensed value such as, for example, a temperature and determine if the sensed value exceeds a threshold. If the sensed value exceeds the threshold, the sensor will output a discrete signal 1, while if the sensed value is below the threshold the sensor will output a discrete signal 0. The speed processor 206 may perform a similar operation by determining if a speed of a component is outside an operational threshold and output a discrete signal appropriately.

The logic process performed by the FPGA 102 may be reprogrammed by simply changing the logic descriptor list (LDL) 212 stored in the RAM. Thus, an interface that allows the LDL 212 to be compiled and updated greatly simplifies programming the logic process performed by the FPGA 102 without using HDL.

A detailed description of a method for programming the LDL 212 that enables the logic processor 202 to perform logic functions is described below. The programming of the LDL and the resultant functions of the FPGA 102 are not limited to the exemplary embodiments described above in FIGS. 1 and 2. The LDL 212 and the logic processor 202 may be used to perform logic functions in a FPGA for virtually any application that incorporates a FPGA. In alternate applications, the FPGA 102 may include additional functionality such as additional inputs and outputs, or may not include some of the above-illustrated features.

Figure 3:
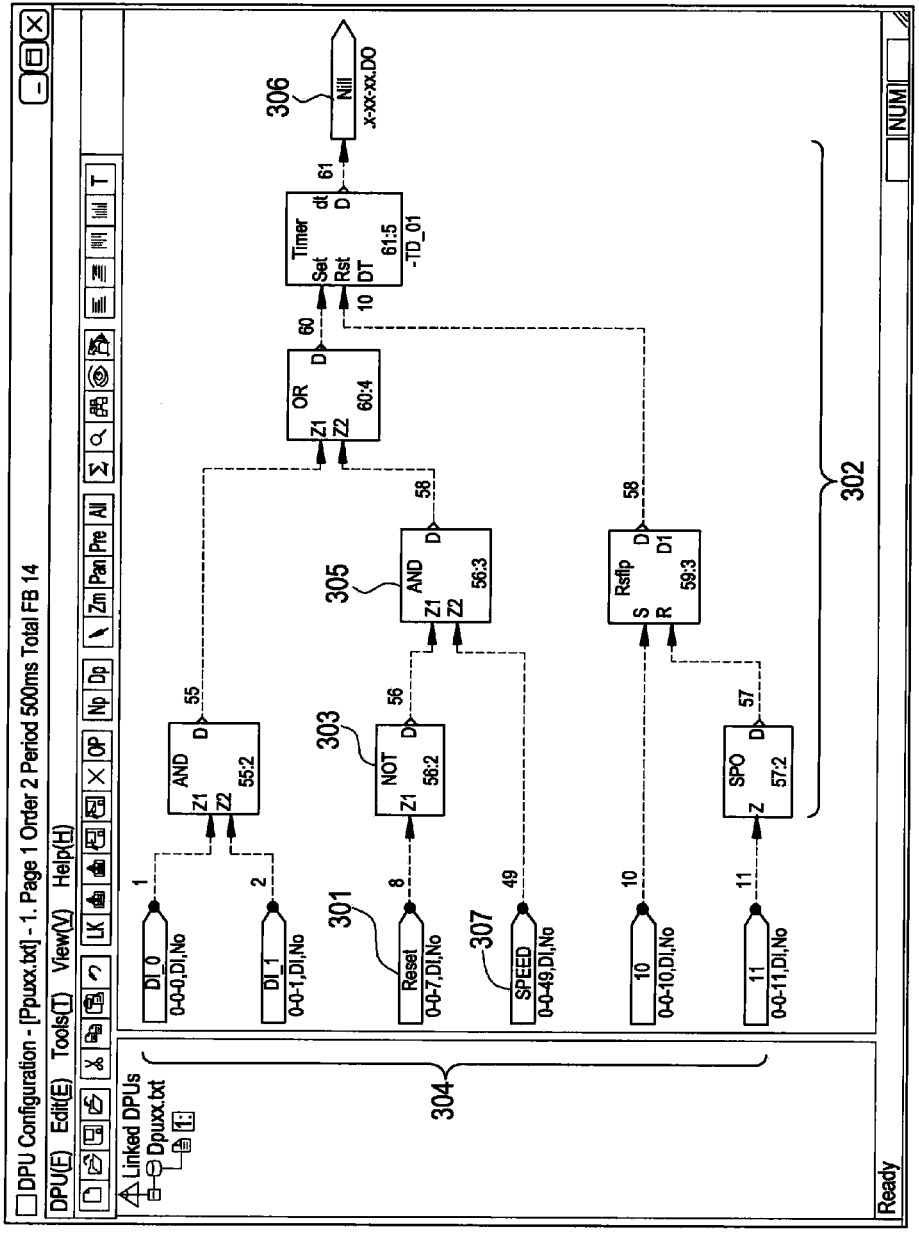
FIG. 3 illustrates an exemplary embodiment of a graphical user interface for programming the FPG?.

FIG. 3 illustrates an exemplary embodiment of a graphical user interface 300 of an application that receives logic processes and may be used to program the logic processes onto the FPGA 102. The graphical user interface 300 includes a window that allows a user to design a schematic diagram of a logic process. In this example, a user has entered a logic process that includes logic functions represented by blocks 302. The logic functions may include, for example, NOT, AND, OR, and timer functions. Inputs to the logic functions are shown by arrows. Input signals 304 to the logic are shown on the left of the window, and an output signal 306 is shown on the right of the window. Each of the input signals, output signals, and logic functions will hereinafter be referred to as nodes.

In the illustrated example of FIG. 3, a node 301 is a reset signal. A node 303 is a NOT logic gate that receives the reset signal from the node 301. A node 305 is an AND logic gate that receives a signal from the node 303 and a speed signal. The output signal 306 is also a node that outputs a result of the logic process.

Once the user has finalized the logic process, each of the nodes is defined and associated with a logic descriptor by the application. If the FPGA 102 does not support bubble logic, any bubble logic gate functions are converted to NOT gates as appropriate. The logic descriptors are ordered sequentially according to the position (logic depth) of each associated node in the logic process. The sequential logic descriptors of the logic process make up a logic descriptor list.

Figure 4:
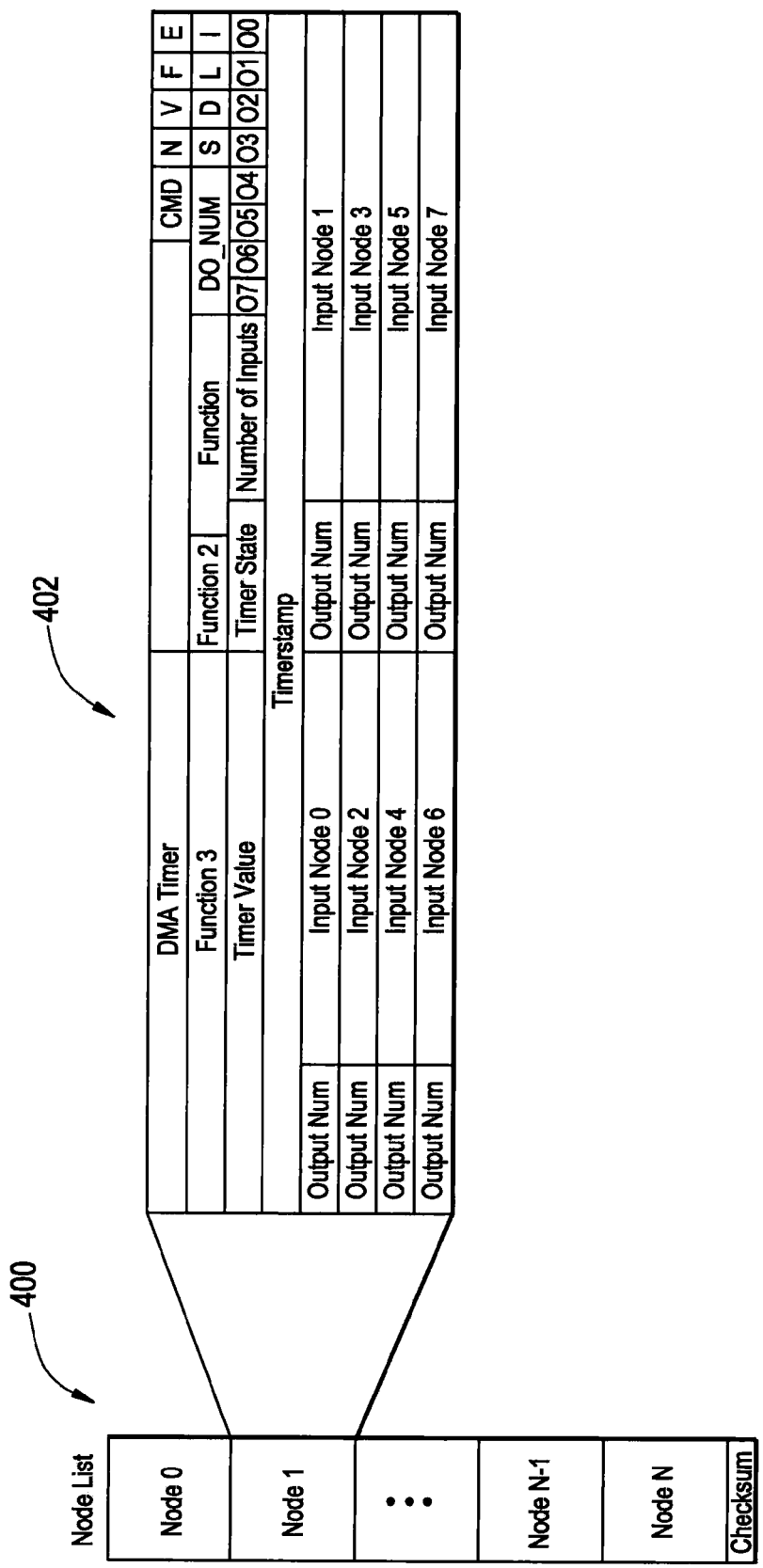
FIG. 4 illustrates an exemplary embodiment of a logic descriptor list and a logic descriptor.

FIG. 4 illustrates an exemplary embodiment of logic descriptor list 400 and an exemplary 32-bit logic descriptor 402. The logic descriptor 402 includes a number of fields. The function of each of the fields is described in the table below.

| Field | Description | Values |
|---|---|---|
| E | Enable bit. Indicates if the Node is enabled. If disabled, the node retains the last value of the node. Once disabled, the F bit may be used to force a value. | 0 - Disabled<br>1 - Enabled |
| F | Force Bit. Indicates that the node should be forced to the value specified by the 'V' bit. The 'F' bit is only valid if the node is disabled. | 0 - Node is not Forced<br>1 - Node is Forced |
| V | Value bit. If the node is an XNetDI node, V indicates the value the node should take. If the node is not an XnetDI node, then if the 'F' bit is set, this bit indicates the value that the node should be forced to. | 0 - logic '0'<br>1 - logic '1' |
| N | New Command bit. Bit is used by the CPU to indicate there is a new DM/A command. | Toggle 0/1, default to 0 |
| CMD | DM/A Command. If the node is a DM/A node, these bits indicate which command should be executed. | 00 - Set<br>01 - Reset<br>10 - Toggle<br>11 - Pulse |
| — | Reserved. | Set to zero |
| Default Bits | Default value of all nodes. If the node is an XNetDI or DM/A, this indicates both the initial value of the node, and the value it returns to if the CPU fails. | 0 - logic '0'<br>1 - logic '1'<br>for up to 8 outputs |
| DMA Timer | 16-bit time value for DM/A node. If the DM/A command is PULSE, then this time, specified in milliseconds indicates the pulse width. | 0 to FFFF |
| I | Invert Bit. ONLY VALID FOR XDI and XDO. Indicates the input/output should be inverted. | 0 - Do not invert<br>1 - Invert |
| L | Indicates this is the Last node in the list. The FPGA will go back to the first node after evaluating this node. | 0 - Not the Last Node<br>1 - Last Node |
| S | Save bit. This is internal to the FPGA. It stores the state of N bit. If the N and S bits do not match, the FPGA knows there is a new DM/A command to process. After processing the command, the S bit is updated. | Set = N bit |
| DO_NUM | Discrete Output Number. If this is a DO, this indicates which physical output to drive. | 0 - 7 |
| Function | Logic Function to perform. Includes AND, OR, NOT, M out of N, Timer, etc. If the function is XDI, then the "Function 2" field is used to indicate if the XDI has a TIMER built in (TD_ON or TD_OFF). If there is a TIMER built into the XDI, then "Function 3" indicates the period of the timer. If the function is M out of N, then the "Function 3" field specifies M, and the "Number of Inputs" field specifies N. If the function is TIMER, then the "Function 2" field indicates Pulse(1), TD_ON(2), TD_OFF(3). Then a 16-bit delay value (in ms) is specified in the "Function 3" field. | 0 - XDI<br>1 - AND<br>2 - OR<br>3 - NOT<br>4 - XOR<br>5 - M out of N<br>6 - TIMER<br>7 - RS Flip-Flop<br>8 - DMA<br>9 - Speed<br>10 - XNetDI<br>11 - XDO |
| Function 2 | Multi-purpose. See "Function" | 0 to 3 |
| Function 3 | Multi-purpose. See "Function" | 0 to FFFFh |
| O0-O7 | Bit Masks indicating the logic state for up to eight outputs for the node. | B00000000 to b11111111 |
| Number of Inputs | Indicates how many inputs to the node. Each gate or function block can support up to 24 inputs. Any gate requiring more is cascaded. For example, a three input OR gate would have a value of 3. A NOT gate would have a value of 1. A physical input or "internal DI" has no inputs, so a value of 0 is be used. | 0 to 8 inputs per node are allowed. |
| Timer State | For internal use. The FPGA uses this field to store the state of any TD_ON, TD_OFF, or PULSE functions. | Internal |
| Timer Value | For internal use. The FPGA uses this field to store the delay time for any TD_ON, TD_OFF, and PULSE functions. | Internal |
| Timestamp | 32-bit timestamp of the last time the node was updated. | 0 to FFFFFFFFh |
| Input Node List | A consecutive list of the inputs for the node. Each value is the 12-bit node number of the input along with the 4-bit output number of that node. Since each node can drive multiple outputs, this indicates which individual output is used. For XDI and Speed functions, "Input Node 0" indicates the physical address of the XDI or speed input. That is 0-47 for XDI and 0-5 for speed. | 8 words in length. Each input supports a value between 0 and 4096. |

The functions described above include basic logic functions (AND, OR, NOT etc.) and other logic functions. In this regard, the XDI function is a discrete input function where an XDI node is configured to receive a discrete input signal. The XnetDI function is similar to the XDI function, but an XnetDI node is configured to receive a discrete input signal over a network protocol such as, for example, Ethernet. The XDO function configures a node to output a discrete output. The DMA function configures a node for software control. The software may direct the node to output a high signal, a low signal, a pulse signal, or toggle signals based on software processed inputs. The M out of N function directs a node to conduct a comparison, for example, if at least "two out of three" inputs to the node are high, the node will output a high signal while if less than "two out of three" inputs to the node are high, the node will output a low signal. The timer function directs a node to act as a timer, with the function 2, function 3, timer state, and timer value fields of the logic descriptor 402 defining and enabling the timer operation of the node.

Once application defines the logic descriptors 402, and the logic descriptor list 400, the logic descriptor list 400 may be uploaded into the RAM 212 (of FIG. 2) of the FPGA 102. The logic processor 202 of the FPGA 102 may then perform the logic process according to the logic descriptors 402.

Figure 5:
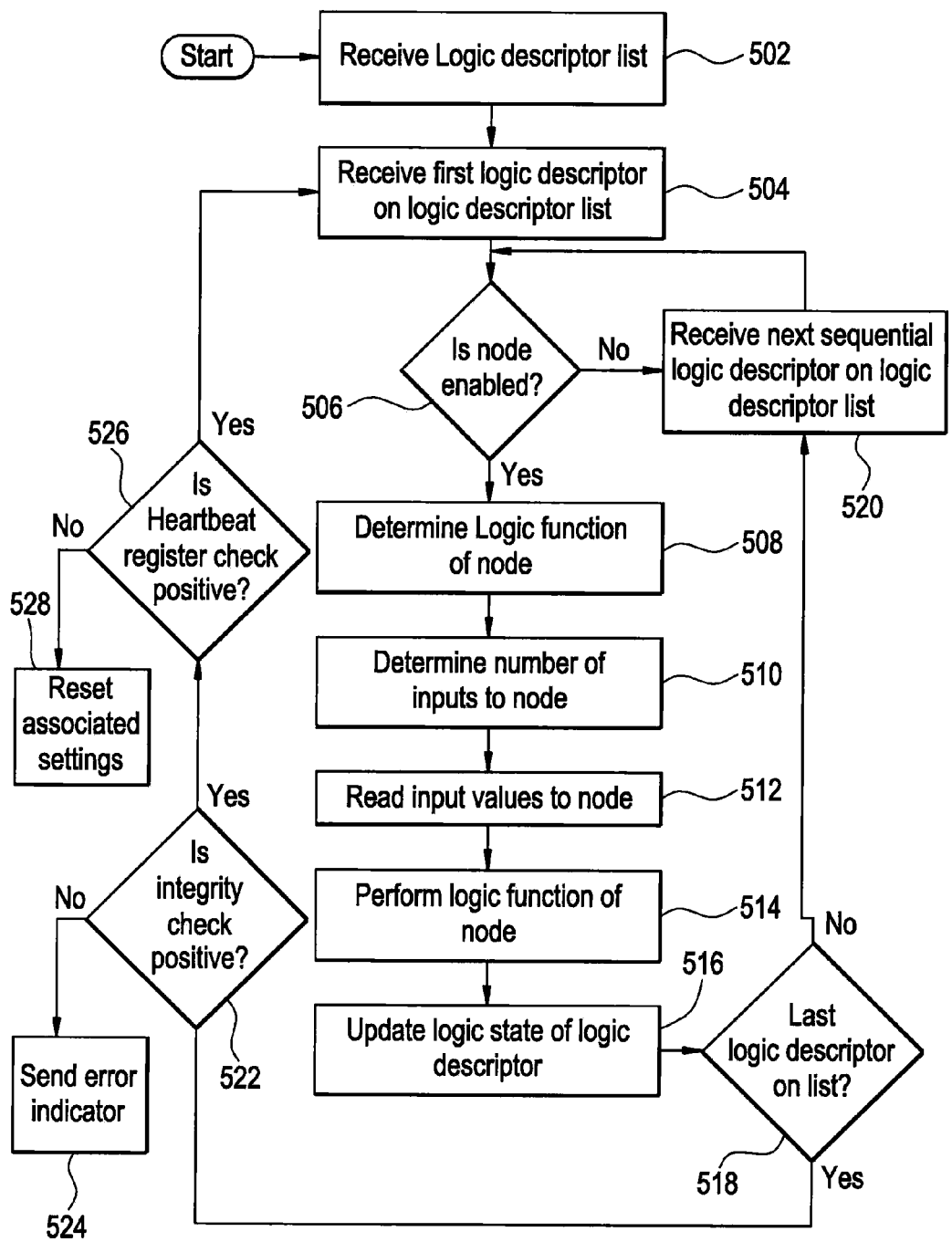
FIG. 5 illustrates a block diagram of an exemplary method of operation of a logic processor of FIG. 2.

FIG. 5 illustrates a block diagram of an exemplary method of operation of the logic processor 202. The method begins when the logic processor 202 receives the logic descriptor list 400 (of FIG. 4). The logic processor 202 processes the logic descriptors 402 in logic descriptor list 400 in sequential order starting with the first logic descriptor 402 on the logic descriptor list 400. The first logic descriptor 402 that defines a first node is received in block 504. In block 506, it is determined whether the first node is enabled as indicated in by the enablement bit indicator "E". If the node is enabled, the logic function of the node is determined in block 508. A number of inputs to the node is determined in block 510. Once the number of inputs are determined, the input values to the node are read in block 512. In block 514, the logic function of the node is performed. The result of the logic function is updated and saved in the O0-O7 field of the first logic descriptor 402. In block 518 the "L" field of the logic descriptor 402 is read to determine if the logic descriptor 402 is sequentially the last logic descriptor 402 on the logic descriptor list 400. If the logic descriptor 402 is not the last logic descriptor 402 on the logic descriptor list 400, the next sequential logic descriptor 402 on the logic descriptor list 400 is received by the logic processor 202 in block 520 and processed in a similar manner as described above. If the logic descriptor 402 is the last logic descriptor 402 on the logic descriptor list 400, the first sequential logic descriptor 402 on the logic descriptor list 400 is processed in a similar manner as discussed above, and the process repeats.

The sequential order of the logic descriptors 402 in the logic descriptor list 400 is partially determined by the inputs of the nodes. For example, referring to FIG. 3, since the node 303 and the node 307 send an outputs to the node 305, the logic descriptors 402 defining the nodes 303 and 307 should be listed prior to the logic descriptor 402 defining the node 305 on the logic descriptor list 400. As long as the inputs to the node 305 are processed prior to the processing of node 305, the logic process may be performed successfully.

An integrity check may be included that allows the integrity of the logic descriptor list 400 to be monitored. The integrity check may include, computing a checksum for the logic descriptor list 400. After each logic descriptor 402 is processed, and the logic state of the logic descriptor is updated, a checksum of the logic descriptor is computed and added to a checksum of the previously processed logic descriptors 402. Once the last logic descriptor 402 of the logic descriptor list 400 is processed, the checksum of the previously processed logic descriptors 402 is compared to the checksum of the logic descriptor list 400. If the checksums match, the process continues by processing the first logic descriptor 402 as described above. If the checksums fail to match, an error indicator may be sent. The error indicator may be used to indicate a failure of the system. In ETS applications, the an error indicator may initiate a shutdown of the generator 103 (of FIG. 1). The integrity check is not limited to checksums, and may use other types of data integrity checking methods, such as, for example a cyclic redundancy check (CRC), or other applicable data integrity checking methods.

The FPGA 202 may include a register that allows a determination of whether the FPGA 202 is receiving inputs from the CPU 104. In operation the register receives an indicator from the CPU 104 that changes periodically (a heartbeat). The FPGA 202 may check the register to determine if the indicator has changed in a defined time period (as shown in block 526 of FIG. 5). If the indicator fails to change in the defined time period, the connection to the CPU 104 may be lost, or the CPU 104 may have failed. If a failure is determined, an error indicator may be sent, and the FPGA 202 may accommodate the failure with appropriate logic (as shown in block 528 of FIG. 5). The heartbeat check may be useful for example, if the CPU 104 has directed the FPGA 202 to turn off inputs due to a systems test. If the CPU 104 fails prior to directing the FPGA 202 to turn the inputs on, the heartbeat check will indicate a failure. The FPGA may then turn the inputs on to return to normal operation without direction from the CPU 104.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A method for programming logic in a field programmable gate array (FPGA) comprising:
   receiving a logic process including a logic node;
   associating the node with a logic descriptor including:
      a unique identifier of the node;
      an enabling indicator operative to indicate if the node is enabled;
      a function indicator operative to define a logic function performed by the node;
      an input number indicator operative to define a number of inputs of the node;
      an output indicator operative to indicate a logic state of an output of the node; and
      an input indicator operative to indicate a unique identifier of an input of the node; and
   saving the logic descriptor in a memory of the FPGA.

2. The method of claim 1, wherein the logic descriptor further includes a last node indicator operative to indicate if the node is a last node in the logic process.

3. The method of claim 1, wherein the logic descriptor further includes an invert indicator operative to indicate if the output of the node is inverted.

4. The method of claim 1, wherein the logic descriptor further includes a default indicator operative to indicate a default value of the node is output by the node if the enabling indicator indicates that the node is disabled.

5. The method of claim 1, wherein the logic descriptor further includes a default value of the node.

6. The method of claim 1, wherein the logic descriptor further includes a unique identifier of a discrete output of the FPGA driven by the node.

7. The method of claim 1, wherein the logic descriptor further includes a time stamp indicator operative to indicate a last time the node was updated.

8. The method of claim 1, wherein the logic descriptor further includes:
   a second function indicator operative to indicate a function of a timer function of the node; and
   a second function indicator operative to indicate a delay value of the timer function of the node.

9. The method of claim 1, wherein the logic descriptor further includes a second function indicator operative to indicate a number of inputs compared in an M out of N function of the node.

10. The method of claim 1, wherein the logic descriptor further includes a discrete output value output by the node.

11. The method of claim 1, wherein the logic descriptor further includes a indicator of whether the node is operative to receive an input controlled by software on a processor.

12. A method for performing a logic process in a field programmable gate array (FPGA) comprising:
   receiving a logic descriptor list having a first logic descriptor including an unique identifier of a first node in the logic process, an enabling indicator, a logic function indicator, and an input indicator;
   processing the first logic descriptor by:
      determining whether the enabling indicator of the logic descriptor indicates that the first node is enabled;
      determining a logic function associated with the first node from the logic function indicator;

determining a number of inputs to the first node from the input indicator;

reading an output value associated with an input to the first node the from a second logic descriptor associated with a second node in the logic process;

performing the logic function to determine a logic state of the first node; and updating the logic state of the first node in the first logic descriptor responsive to performing the logic function;

determining whether the first logic descriptor indicates that the first logic descriptor is sequentially the last logic descriptor in the logic descriptor list;

outputting a signal associated with the logic process, and receiving and processing a logic descriptor that is sequentially an initial logic descriptor in the logic descriptor list responsive to determining that the first logic descriptor is sequentially the last logic descriptor in the logic descriptor list;

receiving and processing a logic descriptor that is sequentially the next logic descriptor following the first logic descriptor in the logic descriptor list responsive to determining that the first logic descriptor is not sequentially the last logic descriptor in the logic descriptor list; and receiving and processing a logic descriptor that is sequentially the next logic descriptor following the first logic descriptor in the logic descriptor list responsive to determining that the first logic descriptor is disabled.

13. The method of claim 12, wherein the method further comprises:

performing a data integrity check responsive to determining that the first logic descriptor is sequentially the last logic descriptor in the logic descriptor list; and sending an error indicator responsive to determining that the data is corrupted.

14. The method of claim 12, wherein the method further comprises:

determining whether a register value has been updated by a processor in a defined time period;

sending a processor input failure signal responsive to determining that the register value has not been updated by the processor in the defined time period.

15. The method of claim 14, wherein the method further comprises operating the FPGA in a normal operating mode responsive to receiving the processor input failure signal.

16. An electronic safety trip system for a generator comprising an electronic safety trip portion having an FPGA operative to perform the logic process of:

receiving a logic descriptor list having a first logic descriptor including an unique identifier of a first node in the logic process, an enabling indicator, a logic function indicator, and an input indicator;

processing the first logic descriptor by:

determining whether the enabling indicator of the logic descriptor indicates that the first node is enabled;

determining a logic function associated with the first node from the logic function indicator;

determining a number of inputs to the first node from the input indicator;

reading an output value associated with an input to the first node the from a second logic descriptor associated with a second node in the logic process;

performing the logic function to determine a logic state of the first node; and updating the logic state of the first node in the first logic descriptor responsive to performing the logic function;

determining whether the first logic descriptor indicates that the first logic descriptor is sequentially the last logic descriptor in the logic descriptor list;

outputting a signal associated with the logic process, operative to control the generator, and receiving and processing a logic descriptor that is sequentially an initial logic descriptor in the logic descriptor list responsive to determining that the first logic descriptor is sequentially the last logic descriptor in the logic descriptor list;

receiving and processing a logic descriptor that is sequentially the next logic descriptor following the first logic descriptor in the logic descriptor list responsive to determining that the first logic descriptor is not sequentially the last logic descriptor in the logic descriptor list; and receiving and processing a logic descriptor that is sequentially the next logic descriptor following the first logic descriptor in the logic descriptor list responsive to determining that the first logic descriptor is disabled.

17. The method of claim 16, wherein the method further comprises:

performing a data integrity check responsive to determining that the first logic descriptor is sequentially the last logic descriptor in the logic descriptor list; and sending an error indicator responsive to determining that the data is corrupted.

18. The method of claim 16, wherein the method further comprises:

determining whether a register value has been updated by a processor in a defined time period; and sending a processor input failure signal responsive to determining that the register value has not been updated by the processor in the defined time period.

19. The method of claim 18, wherein the method further comprises operating the FPGA in a normal operating mode responsive to receiving the processor input failure signal.

* * * * *